United States Patent

Kano et al.

[11] Patent Number: 4,460,496
[45] Date of Patent: Jul. 17, 1984

[54] PASTE FOR FORMING A TRANSPARENT, CONDUCTIVE FILM

[75] Inventors: Mitsuru Kano; Yoshimi Kamijo, both of Furukawa, Japan

[73] Assignee: Alps Electric Co., Ltd., Japan

[21] Appl. No.: 448,488

[22] Filed: Dec. 10, 1982

[30] Foreign Application Priority Data

Dec. 12, 1981 [JP] Japan .................. 56-199480

[51] Int. Cl.³ .............................. A01B 1/06
[52] U.S. Cl. ..................... 252/518; 252/500; 106/311
[58] Field of Search ............... 252/500, 518; 106/1.05, 106/311

[56] References Cited

U.S. PATENT DOCUMENTS 4,268,539  5/1981  Nohayama et al. ............. 252/518 X
4,303,554  12/1981  Suclo et al. .................. 252/518

Primary Examiner—Josephine Barr
Attorney, Agent, or Firm—Guy W. Shoup; Henry T. Burke

[57] ABSTRACT

A paste for forming a transparent conductive film is provided. The paste comprises an organometallic compound convertible into a transparent conductive metal oxide by calcination, an organic solvent and a thickening agent characterized in that the paste further contains an organic monoazo compound difficultly soluble in the organic solvent, combustible at a high temperature and having the general formula:

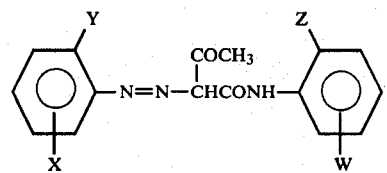

wherein X represents H, $NO_2$ or $OCH_3$ in a m- or p-position, Y represents $NO_2$ or $OCH_3$ in an o-position, Z represents $OCH_3$, $CH_3$ or H in an o-position and W represents H or $CH_3$ in the m- or p-position.

6 Claims, 3 Drawing Figures

| sample NO | Formula of orgamic pigment | solubility (wt %) | printability | area resistance (KΩ/□) | transparency | film condition | film strength | film thichness (Å) |
|---|---|---|---|---|---|---|---|---|
| 1 | OCH₃ COCH₃<br>⟨O⟩-N=N-CHCONH-⟨O⟩ | 20 | 10 | | △ | X (irregularity of film thickness) | △ | 600~1500 |
| 2 | CH₃ COCH₃ OCH₃<br>CH₃-⟨O⟩-N=N-CHCONH-⟨O⟩ | 5.0 | 200 | 2.5 | 0 | 0 | 0 | 1000 |
| 3 | OCH₃ COCH₃ OCH₃<br>⟨O⟩-N=N-CHCONH-⟨O⟩<br>NO | 2.0 | 300 | 2.5 | 0 | 0 | 0 | 1000 |
| 4 | OCH₃ COCH₃ OCH₃<br>NO₂-⟨O⟩-N=N-CHCONH-⟨O⟩ | 0.1 | 300 | 10.0 | X | △ (turbidity) | △ | 1000 |

Fig.1

| sample NO | Formula of organic pigment | solubility (wt %) | printability | area resistance (KΩ/□) | transparency | film condition | film strength | film thickness (Å) |
|---|---|---|---|---|---|---|---|---|
| 1 | OCH₃ COCH₃ OCH₃<br>〈O〉-N=N-CHCONH-〈O〉 | 20 | 10 | | △ | × (irregularity of film thickness) | △ | 600~1500 |
| 2 | CH₃ COCH₃ OCH₃<br>CH₃-〈O〉-N=N-CHCONH-〈O〉 | 5.0 | 200 | 2.5 | ○ | ○ | ○ | 1000 |
| 3 | OCH₃ COCH₃ OCH₃<br>〈O〉-N=N-CHCONH-〈O〉<br>NO | 2.0 | 300 | 2.5 | ○ | ○ | ○ | 1000 |
| 4 | OCH₃ COCH₃ OCH₃<br>NO₂-〈O〉-N=N-CHCONH-〈O〉 | 0.1 | 300 | 10.0 | × | △ (turbidity) | △ | 1000 |

| sample No.3 additional percentage | printability | area resistance (KΩ/□) | transparency | film condition | film strength | film thickness (Å) |
|---|---|---|---|---|---|---|
| 0.5 | 200 | 2.5 | ○ | ○ | ○ | 1000 |
| 1.0 | 300 | 2.5 | ○ | ○ | ○ | ∮ |
| 2.0 | 300 | 2.6 | ○ | ○ | ○ | ∮ |
| 3.0 | 300 | 2.9 | ○ | ○ | ○ | ∮ |
| 5.0 | 300 | 4.0 | ○ | ○ | ○ | ∮ |
| 10.0 | 250 | 12.0 | △ | △ | △ | ∮ |
| 15.0 | 50 | 50.0 | × | × | × | 1500 |

PASTE FOR FORMING A TRANSPARENT, CONDUCTIVE FILM

The present invention relates to a paste for forming a transparent, conductive film. The paste forms a transparent conductive film of a metal oxide having a desired pattern as well as a strong adhesion to an insulating base made of a glass or ceramic material on said base by screen printing and calcination.

It has been well known that a film of an oxide of In, Sn, Sb, Cd or the like formed on a glass or ceramic insulating base has a high transmission and conductivity. These films have been used for the production of semiconductor elements, liquid crystal displays, electronic displays and de-icing conductive films for window glasses. The uses of them have become broader recently. These transparent, conductive metal oxide films are formed by chemical spraying, vacuum vapor deposition, immersion or screen printing.

The chemical spraying method is economically disadvantageous, since additional steps such as an etching treatment are required to obtain a film having a fine complicated pattern, though it is advantageous when a film having a relatively large area is necessary. The vacuum vapor deposition method has problems when it is employed in large-scale production, since the treatment is effected batchwise. An improved mask vacuum vapor deposition method has been developed recently to make it possible to omit the etching treatment. The immersion method is suitable for mass production. However, the films formed by this process have properties far inferior to those obtained by the vacuum deposition method. Moreover, the etching treatment is required also in this method, and this is a disadvantage. The screen printing method is free of these problems and has the advantages that a film of a desired pattern can be obtained by printing and calcination and that waste liquid disposal following the etching treatment is unnecessary. However, a pastes for forming transparent, conductive film have poor stability and their workability in screen printing is poor. Thus, this method has the defect that stable points with a fine pattern can not be obtained.

More particularly, an organometallic compound such as an organic acid indium salt having a high ionically bonding property, e.g. indium octylate [$(C_7H_{15}CO_2)_3In$], has been used as such a paste. However, the organometallic compound is easily hydrolyzed, rapidly gels when it is made in the form of a paste and undergoes a chemical change rather easily. Thus, the paste per se has low stability and exhibits poor workability in the screen printing step. Ethylcellulose has been used as the binder in this method. The binder is not completely burnt by calcination and, therefore, the resulting film has relatively high resistance and low film strength.

After intensive investigations made for the purpose of overcoming these defects, the inventors have found that the stability of the paste can be improved and excellent results can be obtained by using (1) an organoindium complex coordinated with acetylacetone (Hacac) such as trisacetylacetonatoindium (III) [$In(acac)_3$] as a compound which forms a metal oxide film by calcination and (2) an organotin complex such as dimethyltinacetylacetonate [$(CH_3)_3Sn(acac)_2$] as a resistance-controlling tin compound. The inventors have also found that if nitrocellulose is used as a thickening agent, a film having strong adhesion and low resistance can be obtained.

However, even if nitrocellulose is used, life of the paste is shorter than that obtained when ethylcellulose is used and the problem of the workability in the screen printing still remains unsolved. After further investigations, the inventors have found that the properties can be improved by using deacidified nitrocellulose and an organic solvent mixture of, for example, butylcarbitol, butyl cellosolve, benzyl acetate and dimethyl phthalate. The inventors have attempted to improve the printability by adding an oil-soluble organic dyestuff. However, the printability was still insufficient. Particularly, the printability in the screen printing of a fine pattern of around 0.1 mm is yet insufficient.

An object of the present invention is to provide a paste for forming an excellent, transparent, conductive film having high stability, good printability for fine patterns, high printing workability and excellent film-forming properties.

For attaining this object, the present invention is characterized in that a metal component-free organic monoazo compound difficultly soluble in organic solvents and substantially completely combustible at a temperature as high as 400° C. is incorporated in a paste comprising an organometallic compound, the organic solvent and a thickening agent.

BRIEF DESCRIPTION OF DRAWINGS

FIGS. 1 and 3 show physical properties of the transparent, conductive films prepared in accordance with the present invention. FIG. 2 shows the burning properties of the organic monoazo compounds used in the present invention.

Figures 2, 3:
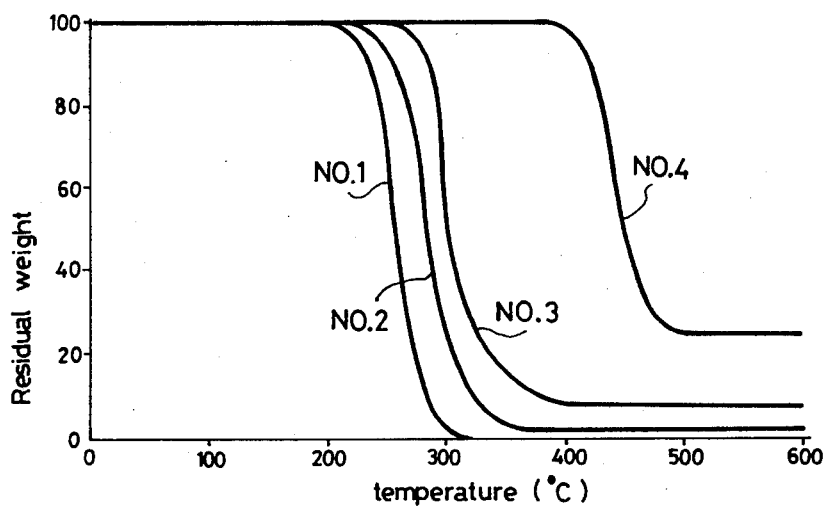

As the number of printing shots is increased, the viscosity of the paste is slightly increased or bleeding occurs in the pattern to deteriorate the printability and also to make the printing of a fine pattern difficult. The inventors have noted this point and succeeded in remarkably improving the printability and printing life of the paste by incorporating an organic monoazo compound in the paste to make the paste thixotropic.

The organic monoazo compounds used in the present invention desirably satisfy the following conditions:

(1) The compounds have an average particle size of less than about 1 μm.
(2) They are difficultly soluble in an organic solvent used for the preparation of the paste. More particularly, they have a solubility therein of up to about 0.2 wt. %.
(3) They are relatively poor in reactivity with the thickening agent, organic solvent or organometallic compound.
(4) They start to decompose at around 300° C. and they are substantially completely burnt away at 400° C. The amount of residue after the calcination at 500° C. is low.
(5) They are free of metal components.

As the organic compounds satisfying these conditions, there may be mentioned organic monoazo compounds of the following formula:

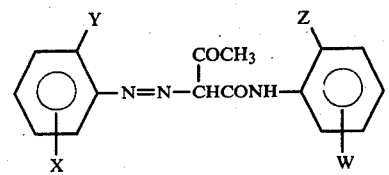

wherein X represents H, NO₂, CH₃, OCH₃ or the like in an m- or p-position, Y represents OCH₃, NO₂, CH₃ or the like in an o-position, Z represents H, OCH₃, CH₃ or the like in an o-position, and W represents H, CH₃ or the like in a m- or p-position.

The paste containing the organic compound is prepared as will be shown below. The organometallic compound soluble in the organic solvent and convertible into the metal oxide by calcination, the material for controlling the resistance, the organic solvent and the thickening agent are mixed together. The organic monoazo compound is then added to the mixture. It may be added thereto prior to the addition of the thickening agent.

As the organometallic compounds convertible into the metal oxides by calcination, there may be used organoindium complexes coordinated with acetylacetone such as trisacetylacetonatoindium. As the organometallic compounds for controlling the resistance, there may be used, for example, dimethyltin acetylacetonate. As the organic solvents, there may be mentioned high-boiling alcohols such as terpineol, 2-ethylhexanol and benzyl alcohol; high-boiling esters such as benzyl acetate, carbitol acetate and dimethyl phthalate; and high-boiling alcohol ethers such as butylcellosolve, carbitol and butylcarbitol. As the thickening agent, deacidified nitrocellulose is suitable.

The following examples will further illustrate the present invention.

EXAMPLE 1

For examining the relationship between the variety of the organic compound to be added to the paste and printability, solubilities of organic monoazo compounds in an organic solvent mixture (butylcarbitol:butylcellosolve:benzyl acetate:dimethyl phthalate = 4:2:2:2) were examined. Then, a paste for the examination of the printability was prepared by using 2.69 wt. % of In(acac)₃ as the compound which forms a transparent, conductive metal oxide film by calcination, 0.31 wt. % of (CH₃)₂Sn(acac)₂ as the resistance-controlling agent, the above-mentioned organic solvent mixture as the organic solvent and 15 wt. % of deacidified nitrocellulose as the thickening agent. The organic monoazo compound was added to the mixture in an amount of its solubility (wt. %) plus 1 wt. % to obtain a paste. On the other hand, a 0.1 mm pattern was formed on a screen printing plate made of 250 mesh stainless steel net. The screen printing was effected with the paste prepared as above on the screen printing plate. After examining the printability, it was pre-dried at 150° C. for 20 min and then burnt at 500° C. for 30 min and then properties of the film thus formed were examined. The solubility, printability and properties of the film are summarized in FIG. 1. The dissolution tests were carried out at room temperature. As for the transparency, higher than 95% visible resion was shown by ◯, 90-95% was shown by Δ and less than 90% was shown by X.

It is apparent from FIG. 1 that the organic compound of Sample No. 3 had excellent properties. A reason therefor is considered to be related to the solubility of the organic monoazo compound in the organic solvent and thermal properties thereof. Namely, the compound is difficultly soluble in the organic solvent and burnt out at a temperature of up to 400° C. and the amount of the calcination residue thereof at 500° C. is small. For illustrating the latter, the thermal behavior of each organic compound was examined to obtain the results shown in FIG. 2. In the calcination tests, the temperature elevation rate was 5° C./min. It is apparent from FIG. 2 that the residue of Sample 4 after calcination at 500° C. was more than twenty percent. It is considered that such a large amount of the residue invites the increase in the area resistance and the deterioration of the film conditions. The thermal unstabilization is caused generally as the solubility in the organic solvent is increased. In Samples Nos. 1 and 2 which have an excessively high solubility, the printability is inferior to the others. On the other hand, Sample No. 3 was quite difficultly soluble and the residue after calcination at 500° C. is low. However, the thermal behavior thereof is similar to that of In(acac)₃ or (CH₃)₂Sn(acac)₂ which forms the metal oxide after the calcination. Therefore, it has excellent printability and other properties. Thus, it has been proved that properties of the paste can be improved remarkably by incorporating an organic compound having a solubility and thermal properties like those of sample No. 3.

EXAMPLE 2

The organic monoazo compounds satisfying the conditions required of the paste for forming transparent, conductive films were chosen in Example 1. A suitable amount thereof to be added was determined by preparing pastes having nearly the same compositions as above except that the amount of sample No. 3 was varied. The tests were carried out in the same manner as in Example 1 to obtain the results shown in FIG. 3. It is apparent from FIG. 3 that with 1.0 to 5.0 wt. % of sample No. 3, excellent printability and other characteristics can be obtained.

EXAMPLE 3

The same procedure as in Examples 1 and 2 was repeated except that organic monoazo compounds of the following formulae were used. Substantially the same results were obtained. It was revealed that the monoazo compounds used were excellent and almost similar to Sample No. 3.

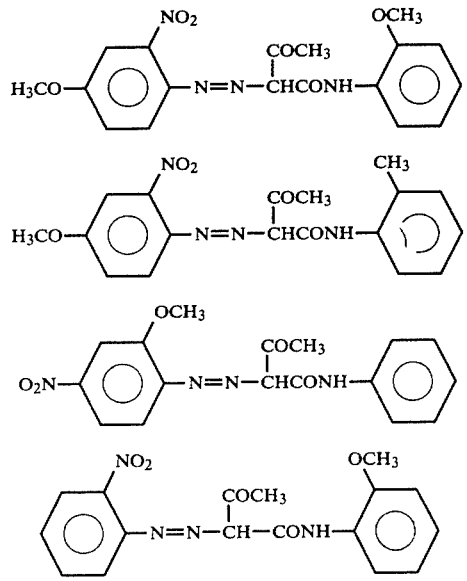

The construction of the present invention is as described above. According to the present invention, there is provided a paste for forming a transparent, conductive film which paste has a high stability and good workability and which paste makes it possible to print a fine pattern.

What is claimed is:

1. A paste for forming a transparent, conductive film comprising 2.69% In(acac)₃ and 0.31% (CH₃)₃Sn(acac)₂; a mixed solvent comprising butyl carbitol, butyl cellusolve, benzyl acetate and dimethyl phthalate in a ratio of 4:2:2:2 and ethers 15%; deacidified nitrocellulose; and from 1.0 to 5.0 wt % of an organic monoazo compound having a solubility in the organic solvent up to about 0.2 wt %, leaving substantially no residue on calcination at 500° C., and represented by the formula

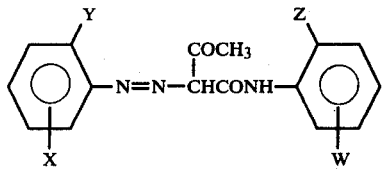

wherein X is H, NO₂, or OCH₃ in the m- or p-position; y is OCH₃, NO₂, CH₃ in the o-position; Z is H, CH₃ or OCH₃ in the o-position; and W is H or CH₃ in the m- or p-position.

2. A paste as in claim 1 wherein the monoazo compound is represented by the formula:

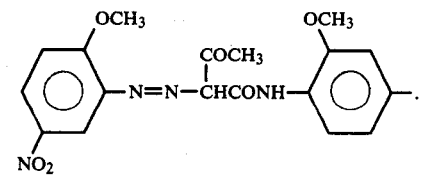

3. A paste as in claim 1 wherein the monoazo compound is represented by the formula

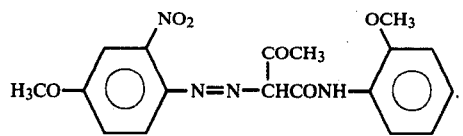

4. A paste as in claim 1 wherein the monoazo compound is represented by the formula

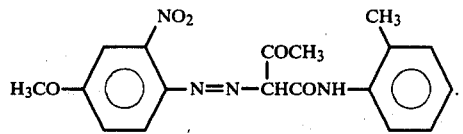

5. A paste as in claim 1 wherein the monoazo compound is represented by the formula

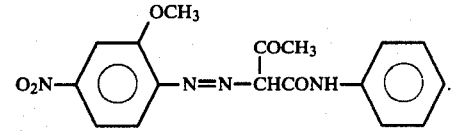

6. A paste as in claim 1 wherein the monoazo compound is represented by the formula

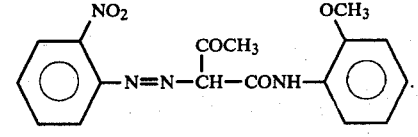

* * * * *